United States Patent
Huang et al.

(10) Patent No.: US 6,844,801 B2
(45) Date of Patent: Jan. 18, 2005

(54) METHODS AND APPARATUS FOR ADJUSTING CENTER MAGNETIC FIELD OF A MAGNETIC FIELD GENERATOR FOR MRI

(75) Inventors: Jinhua Huang, Florence, SC (US); Bu-Xin Xu, Florence, SC (US); Weijun Shen, Florence, SC (US); Ronald Floyd Lochner, Florence, SC (US)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 0 days.

(21) Appl. No.: 10/407,887

(22) Filed: Apr. 4, 2003

(65) Prior Publication Data

US 2004/0196126 A1 Oct. 7, 2004

Related U.S. Application Data

(60) Provisional application No. 60/320,037, filed on Mar. 21, 2003.

(51) Int. Cl.[7] .................................................. H01F 7/00
(52) U.S. Cl. ....................... 335/296; 335/301; 335/306; 324/319; 324/320
(58) Field of Search ......................... 335/216, 296–306; 324/318–320

(56) References Cited

U.S. PATENT DOCUMENTS

| | | | |
|---|---|---|---|
| 5,668,516 A | | 9/1997 | Xu et al. |
| 5,999,076 A | | 12/1999 | Becker, Jr. et al. |
| 6,037,850 A | * | 3/2000 | Honmei et al. ............. 335/216 |
| 6,252,405 B1 | | 6/2001 | Watkins et al. |
| 6,358,582 B1 | | 3/2002 | Nagendra et al. |
| 6,452,472 B1 | * | 9/2002 | Aoki et al. ................. 335/296 |
| 6,504,461 B2 | | 1/2003 | Huang et al. |

* cited by examiner

Primary Examiner—Ramon M. Barrera
(74) Attorney, Agent, or Firm—Carl B. Horton, Esq.; Armstrong Teasdale LLP

(57) ABSTRACT

A product line of MRI systems includes a first MRI system including a first yoke and a plurality of magnet blocks forming a first central assembly disposed on the first yoke. The product line also includes a second MRI system including a second yoke, a plurality of magnet blocks forming a second central assembly disposed on the second yoke and shaped the same as the first central assembly, and a first set of magnet blocks mounted to the second yoke at a periphery of the second central assembly.

20 Claims, 3 Drawing Sheets

METHODS AND APPARATUS FOR ADJUSTING CENTER MAGNETIC FIELD OF A MAGNETIC FIELD GENERATOR FOR MRI

CROSS REFERENCE TO RELATED APPLICATIONS

This application claims the benefit of U.S. provisional application Ser. No. 60/320,037 filed Mar. 21, 2003.

BACKGROUND OF THE INVENTION

This invention relates to magnetic resonance image (MRI) imaging, and, more particularly, to methods and apparatus for assembling magnetized permanent magnetic blocks used for an MRI magnetic field generator.

A high uniform magnetic field is useful for using magnetic resonance image (MRI) and nuclear magnetic resonance (NMR) systems as a medical device or a chemical/biological device. At least some popular and low maintenance cost MRI systems currently available use a permanent magnet system that creates a middle range uniform field (0.2 to 0.5 Tesla) in a pre-determined space (imaging volume). A permanent magnet system usually uses multiple permanent magnet blocks such as NdFeB to form a single magnetic object and to achieve desire high uniform magnetic field in the imaging volume.

For a magnetic field generator for an MRI system that uses permanent magnets, the magnets used in such an apparatus are often formulated from a plurality of magnetized blocks. However, it is difficult to place un-magnetized material blocks on a yoke plate first and then magnetize each block. Therefore, in actual manufacturing, the blocks are fabricated and then magnetized. The magnetized blocks are then arranged on a yoke plate so that each of the magnet blocks has a same magnetic pole facing upward. A pole piece is then placed on the top of the magnetized blocks.

It is generally known that when a substance such as human tissue is subjected to a uniform magnetic field (polarizing field B0), the individual magnetic moments of the spins in the tissue attempt to align with this polarizing field, but precess about it in random order at their characteristic Larmor frequency. If the substance, or tissue, is subjected to a magnetic field (excitation field B1) which is in the x-y plane and which is near the Larmor frequency, the net aligned moment, or "longitudinal magnetization", MZ, may be rotated, or "tipped", into the x-y plane to produce a net transverse magnetic moment Mt. A signal is emitted by the excited spins after the excitation signal B1 is terminated and this signal may be received and processed to form an image.

When utilizing these signals to produce images, magnetic field gradients (Gx Gy and Gz) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

MRI magnets typically require not only an intensive uniform magnetic field, typically less than 10 ppm within a 40–50 cm spherical volume, but also an accurate center magnetic field value, typically less than 0.5%. For a given design of the RF coil, the bandwidth is fixed. Thus the allowable range of the center magnetic field is also fixed.

One known configuration of the magnetic field generating device for MRI is the open geometry composed of yokes opposite to each other, connected by post(s), magnetic field generating elements, such as permanent magnets and/or superconducting/resistive coils, and other field shaping components, such as pole pieces.

The magnetic field of the magnet as manufactured, is often influenced by the deviation of material properties, the tolerance of manufacturing process and the environment. For Superconducting and resistive magnets, the center field can be easily adjusted by fine tuning the current. For permanent magnet, however, this is not that easy. Mechanisms typically are built into the magnet in order to adjust the magnet center field after the magnet is finished assembly.

BRIEF DESCRIPTION OF THE INVENTION

In one aspect, a product line of MRI systems is provided. The product line includes a first MRI system including a first yoke and a plurality of magnet blocks forming a first central assembly disposed on the first yoke. The product line also includes a second MRI system including a second yoke, a plurality of magnet blocks forming a second central assembly disposed on the second yoke and shaped the same as the first central assembly, and a first set of magnet blocks mounted to the second yoke at a periphery of the second central assembly.

In another aspect, a method of manufacturing MRI systems is provided. The method includes providing a plurality of magnet blocks forming a central assembly disposed on a yoke, measuring a center magnetic field, and adding additional magnet blocks to the yoke when the center magnetic field is not within a predetermined range.

In still another aspect, a method for altering a magnetic field is provided. The method includes measuring a center magnetic field of an MRI system to obtain a center magnetic field value and regulating a temperature of at least one component of the MRI system to change the center magnetic field to a value different the measured value.

In a further aspect, a method for altering a magnetic field is provided. The method includes measuring a center magnetic field of an MRI system to obtain a center magnetic field value and using a B0 controlled shimming to change the center magnetic field to a value different the measured value.

DETAILED DESCRIPTION OF THE INVENTION

As used herein, an element or step recited in the singular and proceeded with the word "a" or "an" should be understood as not excluding plural said elements or steps, unless such exclusion is explicitly recited. Furthermore, references to "one embodiment" of the present invention are not intended to be interpreted as excluding the existence of additional embodiments that also incorporate the recited features.

Figure 1:
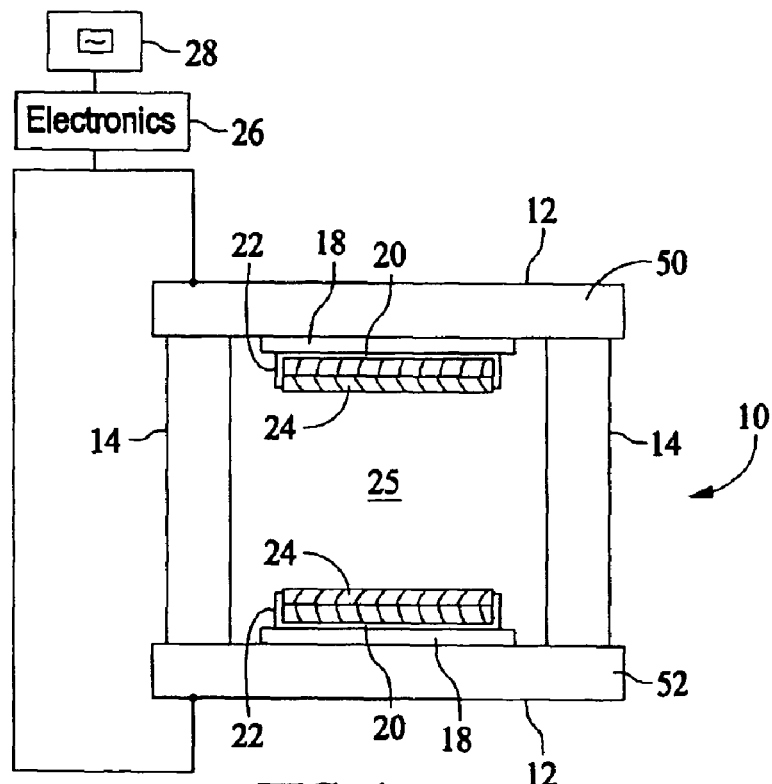
FIG. 1 is a block schematic diagram of an imaging system.
Figure 2:
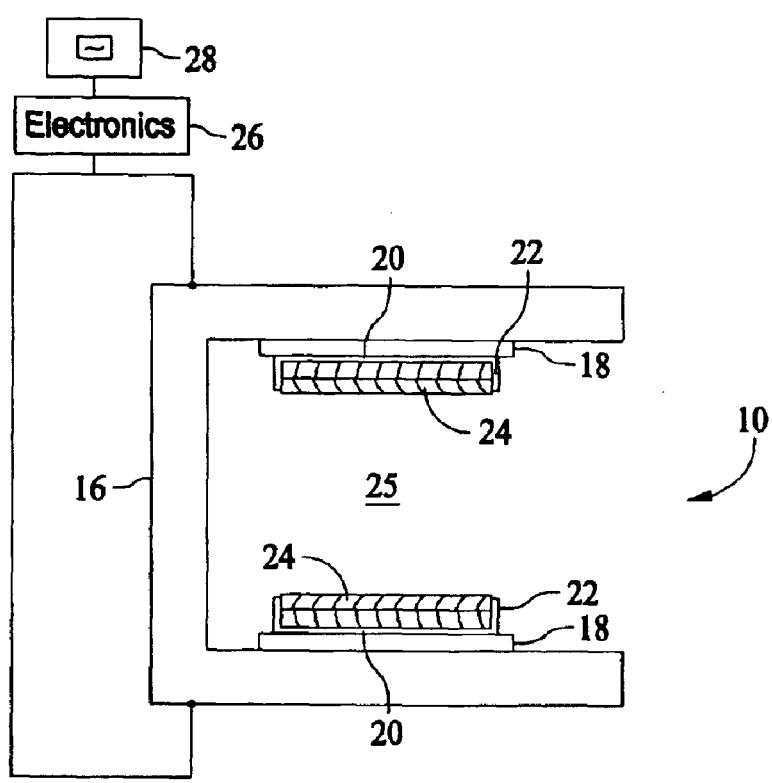
FIG. 2 is a block schematic diagram of an imaging system.

FIG. 1 is a block schematic diagram of an imaging system 10 such as an MRI system 10 including two plate yokes 12 and a plurality of columnar yokes 14 extending between plate yokes 12. Alternatively, an MRI system 10 with a single C shaped yoke 16 may be used as shown in FIG. 2. System 10 includes magnet blocks 18 secured to yoke surfaces, pole piece bases 20 and support rings 22 secured to magnets 18 and a pole piece 24 is secured to each pole piece base 20 and support ring 22. A gap 25 is formed between pole pieces 24. A body part to be imaged is inserted into gap 25.

MRI system 10 also may contain electronics 26 and a display 28. Electronics 26 may include a control system such as a computer, a transmitter, a receiver, an imager and/or a memory.

Figure 3:
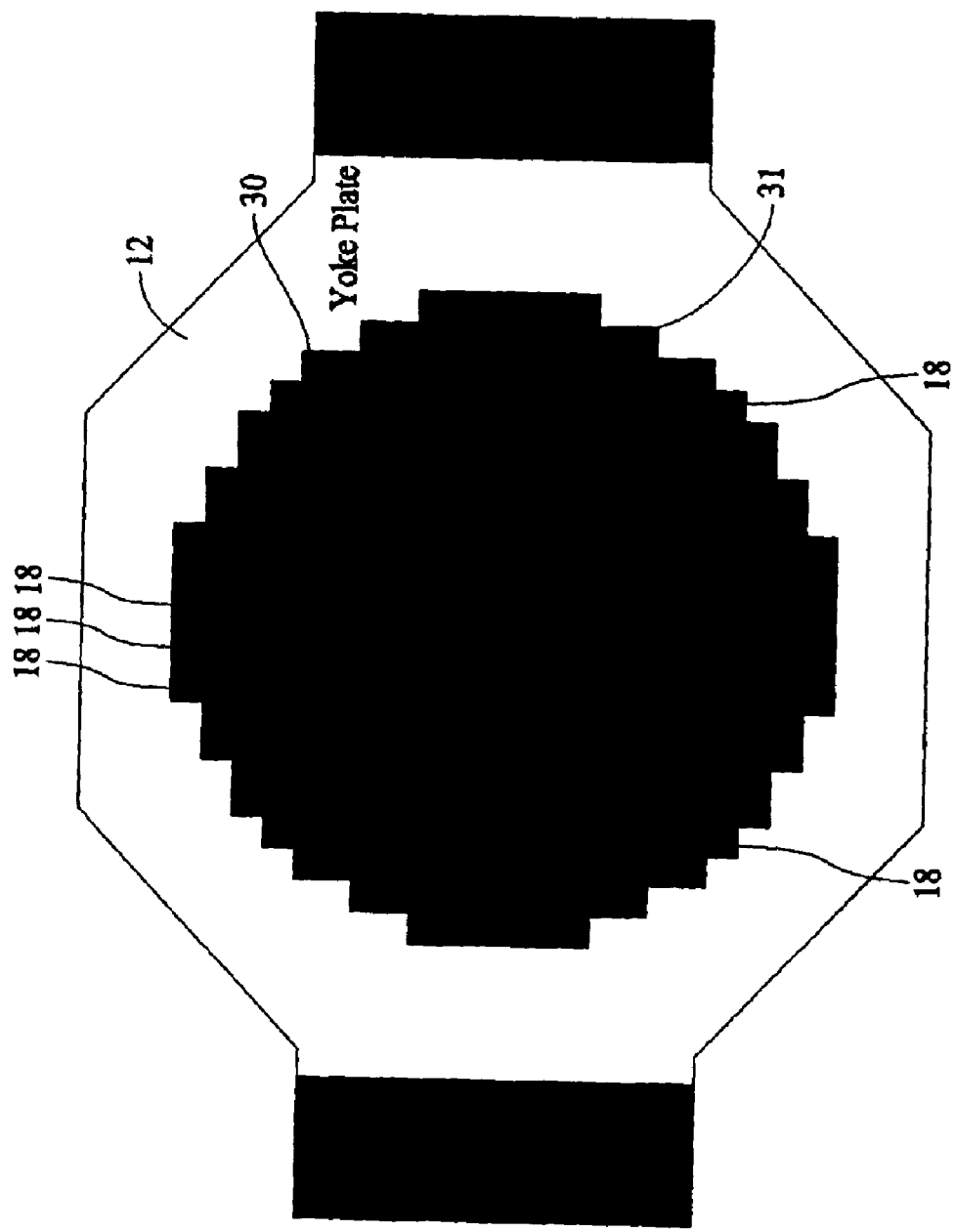
FIG. 3 illustrates a central magnet assembly disposed on the yoke shown in FIG. 1.

FIG. 3 illustrates a central assembly 30 including a plurality of magnetic blocks 18 disposed on yoke 12. Central assembly 30 includes a periphery 31.

In use, central assembly 30 is disposed on yoke 12, and a measurement is taken of a center magnetic field. The measurement is compared to a desired value and if the measured value is different from the pre-determined desired value then the center magnetic field value is altered as herein described. In one embodiment, a temperature of at least one component of the finished assembly 10 is regulated such that the center magnetic field value is substantially equal to the desired value. In an exemplary embodiment, at least one heating element (not shown) is positioned to heat yoke 12. In another embodiment, the center magnetic field value is changed to be closer to the desired value but is several percent away from the desired value falling within a range above and below the desired value. By heating at least one component of finished assembly 10, the center magnetic field is alterable by about 1.5 percent stronger or weaker. Alternatively, the center magnetic field is changed using B0 controlled shimming. Using B0 controlled shimming, the center magnetic field is also alterable by about 1.5 percent stronger or weaker.

With this method, sufficient shimming of a magnet assembly such as central assembly 30 may be achieved without requiring mechanical variations to the magnet assembly after the magnet assembly has been assembled. The method, which may be carried out as a set of instructions of a computer program by one or more computers, analyzes the center magnetic field. A comparison is then made to the desired center magnet field strength, and active and/or passive shim elements may then be incorporated into the magnet assembly at different places to achieve the desired center magnetic field strength. The shimming or weighting factors are used to determine the amount of "shimming material" that is used at each place.

"Shimming material" varies according to the type of shim element. For example, for active shim elements, i.e. shim coils, the shimming material corresponds to the amount of current applied to the coils. By varying the amount of current applied to the coils, the amount contributed to the magnetic field can be varied. As a result, the shim coils can be independently controlled such that field contribution is precisely controlled. For passive shim elements, i.e. iron shims or permanent magnets, the shimming material corresponds to the amount of magnetic element that is added to the magnet assembly.

In accordance with another aspect of the present invention, a computer readable storage medium having a computer program stored thereon to develop a shimming model for a magnet assembly of an MR imaging system, the computer program representing a set of instructions that when executed by a computer causes the computer to change the center magnetic field generated by an assembled magnet assembly. The set of instructions then causes the computer to determine an amount of shimming required at each of the places such that a desired center field strength is maintained.

In an exemplary embodiment utilizing B0 controlled shimming, upon construction of the magnet assembly, the magnet temperature is adjusted and allowed to stabilize. And after the magnet temperature has stabilized, the center field strength is measured. If the center field strength is within a pre-determined range, then a B0 controlled shimming process is not performed, but other downstream processes may be performed, and the magnet assembly is incorporated into an MR assembly. However, if the center field strength is outside the predetermined range, then a B0 controlled shimming process continues with the input of system and shim constraints into one or more computers programmed to determine shimming parameters.

The constraints input include the desired center field strength range and the measured center filed strength. Other inputs include magnet system geometry constraints as well as shimming constraints. The shimming constraints include the physical limitations on each type of potential shim and placement of the shims within the magnet. For example, for active shims, constraints may include the maximum or minimum acceptable current that may be applied to the shim coils or the maximum permanent magnetic material of proper polarity in each predetermined locations to control field contributions. In another example, mass constraints may be input for passive shims such as iron cores. As will be described in greater detail below, these constraints are utilized by a shimming algorithm to determine shim placement, type of shim, and amount of shim at any particular location.

One technique, which is carried out by one or more computers, begins with the reception of system and shim constraints input. From the system and shim constraints, an objective function is formulated. The objective function, which may take one of many forms, is defined to determine a minimum amount of shimming required throughout the magnet assembly such that the desired center field strength is achieved or, if applicable during a field maintenance procedure, is maintained.

From the constraints relative to the objective function, an ideal solution is determined. The ideal solution sets forth the amount of shimming required at a number of locations or target points within the magnet assembly. However, it is necessary to take into consideration that the amount of shimming identified at each location may not be precisely possible. For example, iron shims are fabricated with varying degrees of mass. As such, there may not be an iron shim having the exact particular shim value identified as "ideal". Therefore, it is necessary to discretize the ideal solution at to address variations between the "ideal" shim values and the shim values that are available. From the discretizing process, shim locations and shim amounts are output.

As noted above, the shimming algorithm may utilize one of a number of objective functions designed to address field inhomogeneities and field strength simultaneously. For example, a Linear Programming (LP) approach or implementation may be used or a least squares method. In one LP approach, the objective function may be defined as:

$$\text{Minimize } Obj = \Sigma Vi(Ii+ - Ii-) + \Sigma Wj*Yj \qquad \text{(Eqn. 1).}$$

limited or subjected to the following constraints:

$$-I_{max} \leq I_i^- \leq 0 \qquad \text{(Eqn. 2);}$$

$$0 \leq I_i^+ \leq I_{max} \quad \text{(Eqn. 3);}$$

$$Y_L \leq Yj \leq Y_U \quad \text{(Eqn. 4);}$$

$$B_L \leq AX \leq B_U \quad \text{(Eqn. 5);}$$

Where Ii−, Ii+ are state variables for active abinis, such as resistive, superconducting or permanent magnet shims. For shimming coils, these are the amount of currents of appropriate sign required in the coil. For permanent magnet shims, these are the amounts of permanent magnet material of the appropriate polarity. Yj is the state variables for passive shims. These are the amount of passive shims placed at each location. $V_1$ is the weighting factors for the active shims. $W_j$ is the weighting factors for the passive shims. A is a shim strength matrix of the active and passive at each shim location, either in terms of field contributions to each shimming points or in terms of spherical harmonics including the B0 contribution. X is a vector of all the state variables. $B_L$ and $B_U$ are the constraint lower and upper bound vectors, in terms of field (Gauss, Tesla) or harmonics (ppm). These are the actual constraints that define the desired center field strength. It should be noted that Eqn. 5 may be characterized as $|AX-B_{target}| \leq \epsilon$ where $B_{target}$ is the target field or harmonics, and $\epsilon$ is the allowable tolerance vector.

Figure 4:
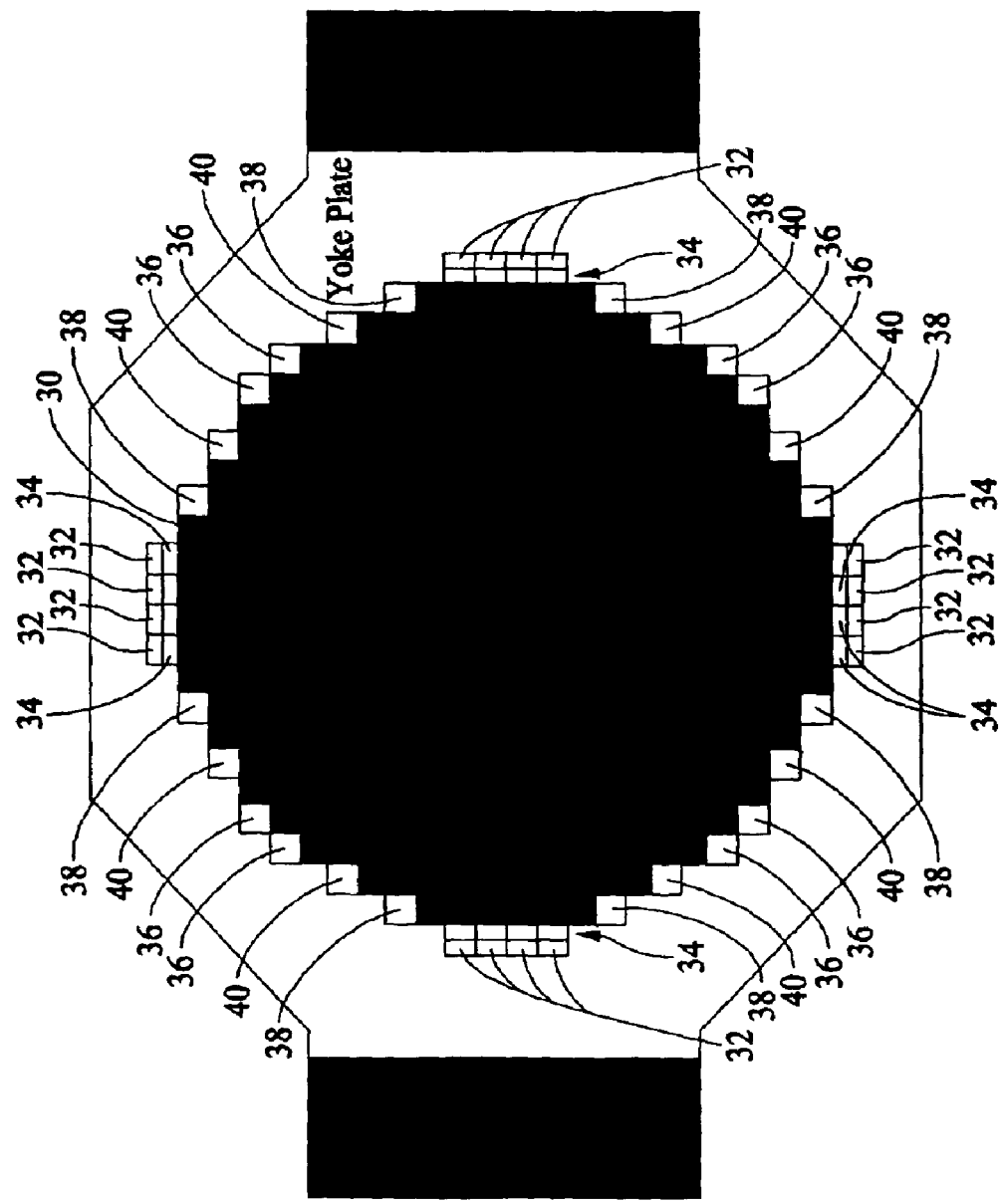
FIG. 4 illustrates a plurality of sets of magnetic blocks disposed illustrates a plurality of sets of magnetic blocks disposed at a periphery of the central assembly shown in FIG. 3.

FIG. 4 illustrates a plurality of sets of magnet blocks 18 mounted to yoke 12. One set includes magnetic blocks 18 numbered 32, another set includes magnetic blocks 18 numbered 34, and another set includes magnetic blocks 18 numbered 36. Still another set includes magnetic blocks 18 numbered 38, while another set of magnetic blocks 18 includes blocks numbered 40 in FIG. 4. In an exemplary embodiment, blocks 32 and 34 are half blocks in that they are approximately one-half the size of all other blocks 18.

In use, central assembly 30 is disposed on yoke 12 and the center magnetic field is measured. In an exemplary embodiment, the center magnetic field is measured such as with a Tesla meter or Gauss meter. The measured value is compared against a desired value and a set of blocks is disposed on yoke 12 at a periphery of central assembly 30. Accordingly, different MRI systems have substantially the same center magnetic field strength but with different configurations of magnetic blocks to account for manufacturing differences between various blocks 18. Also, a single MRI can have different block configurations for a top yoke 50 and a bottom yoke 52 (Shown in FIG. 1) to adjust the center magnetic field. Note that the use of half block and full block additions to central assembly 30 are typically made during an initial fabrication of MRI system 10, while B0 shimming and magnetic block temperature regulation as explained above are typically employed in the field or in the factory after finishing magnet assembly to recalibrate the center magnetic field and field homogeneity, but the effects are cumulative and can be employed together in all permutations of combinations. Using half blocks 32 and 34, the center magnetic field is alterable by about 1 percent stronger or weaker. Using three sets of blocks 36, 38, and 40, the center magnetic field is alterable by about 3.5 percent stronger or weaker.

The herein described methods and apparatus provide a novel approach to changing the center magnetic field. The herein described methods and apparatus also provide methods and apparatus useable during an assembly of an MRI system and after assembly.

Exemplary embodiments of methods and apparatus for changing the center magnetic field are described above in detail. The methods and apparatus are not limited to the specific embodiments described herein, but rather, components of each method and apparatus may be utilized independently and separately from other components described herein. In addition, each method and apparatus component can also be used in combination with other components described herein.

While the invention has been described in terms of various specific embodiments, those skilled in the art will recognize that the invention can be practiced with modification within the spirit and scope of the claims.

What is claimed is:

1. A product line of MRI systems, said product line comprising:
    a first MRI system comprising:
        a first yoke; and
        a plurality of magnet blocks forming a first central assembly disposed on said first yoke; and
    a second MRI system comprising:
        a second yoke;
        a plurality of magnet blocks forming a second central assembly disposed on said second yoke and shaped the same as said first central assembly; and
        a first set of magnet blocks mounted to said second yoke at a periphery of said second central assembly.

2. A product line in accordance with claim 1 wherein said first MRI system further comprises:
    a second set of magnet blocks mounted to said first yoke at a periphery of said first central assembly, said second set in a different configuration than said first set.

3. A product line in accordance with claim 1 wherein said first set of magnet blocks comprises a set of half blocks.

4. A product line in accordance with claim 3 wherein said second MRI system further comprises a second set of half blocks disposed on said second yoke adjacent said first set.

5. A method of manufacturing MRI systems, said method comprising:
    providing a plurality of magnet blocks forming a central assembly disposed on a yoke;
    measuring a center magnetic field; and
    adding additional magnet blocks to the yoke when the center magnetic field is not within a predetermined range.

6. A method in accordance with claim 5 wherein said adding additional magnet blocks comprises adding additional magnet blocks to the yoke at a periphery of the central assembly when the center magnetic field is not within a predetermined range.

7. A method in accordance with claim 5 wherein at least some additional magnet blocks comprises a first set of half blocks.

8. A method in accordance with claim 7 wherein at least some additional magnet blocks comprise a second set of half blocks disposed adjacent the first set at periphery of the central assembly.

9. A method for altering a magnetic field, said method comprising:
    measuring a center magnetic field of an MRI system to obtain a center magnetic field value; and
    regulating a temperature of at least one component of the MRI system to change the center magnetic field to a value different the measured value.

10. A method in accordance with claim 9 further comprising comparing the measured value to a pre-determined value, said regulating a temperature further comprises regulating a temperature of at least one component of the MRI system to change the center magnetic field to a value substantially equal to the pre-determined value.

11. A method in accordance with 9 wherein said regulating a temperature comprises regulating a temperature of at least one component of the MRI system and using a B0 controlled shimming to change the center magnetic field to a value different the measured value.

12. A method in accordance with claim 9 further comprising comparing the measured value to a pre-determined value, said regulating a temperature further comprises regulating a temperature of at least one component of the MRI system and using a B0 controlled shimming to change the center magnetic field to a value to a value substantially equal to the pre-determined value.

13. A method for altering a magnetic field, said method comprising:
   measuring a center magnetic field of an MRI system to obtain a center magnetic field value; and
   using a B0 controlled shimming to change the center magnetic field to a value different the measured value.

14. A method in accordance with claim 13 further comprising comparing the measured value to a pre-determined value, said using a B0 controlled shimming further comprises using a B0 controlled shimming to change the center magnetic field to a value substantially equal to the pre-determined value.

15. A method in accordance with claim 13 wherein said measuring further comprises measuring a center magnetic field of an MRI system to obtain a center magnetic field value, wherein the MRI system comprises:
   a first yoke;
   a plurality of magnet blocks forming a first central assembly disposed on said first yoke;
   a second yoke positioned opposite said first yoke and separated from said first yoke by an imaging gap;
   a plurality of magnet blocks forming a second central assembly disposed on said second yoke and shaped the same as said first central assembly; and
   a first set of magnet blocks mounted to said second yoke at a periphery of said second central assembly.

16. A method in accordance with claim 15 further comprising comparing the measured value to a pre-determined value, said using a B0 controlled shimming further comprises using a B0 controlled shimming to change the center magnetic field to a value substantially equal to the pre-determined value.

17. A method in accordance with claim 15 wherein said using a B0 controlled shimming comprises using a B0 controlled shimming and regulating a temperature of at least one magnet block to change the center magnetic field to a value different the measured value.

18. A method in accordance with claim 17 further comprising comparing the measured value to a predetermined value, said using a B0 controlled shimming comprises using a B0 controlled shimming and regulating a temperature of at least one component of the MRI system to change the center magnetic field to a value substantially equal to the pre-determined value.

19. A method in accordance with claim 18 wherein said measuring further comprises measuring a center magnetic field of an MRI system to obtain a center magnetic field value, wherein the first set of magnet blocks of the MRI system comprises a first set of half blocks.

20. A method in accordance with claim 19 wherein said measuring further comprises measuring a center magnetic field of an MRI system to obtain a center magnetic field value, wherein the MRI system comprises a second set of half blocks disposed on said second yoke adjacent said first set.

* * * * *